(12) United States Patent
Asami et al.

(10) Patent No.: US 7,939,360 B2
(45) Date of Patent: May 10, 2011

(54) SEMICONDUCTOR DEVICE AND MANUFACTURING METHOD THEREFOR

(75) Inventors: Hiroshi Asami, Shizuoka (JP); Yoshihiro Nabe, Tokyo (JP); Akihiro Morimoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 150 days.

(21) Appl. No.: 12/364,072

(22) Filed: Feb. 2, 2009

(65) Prior Publication Data

US 2009/0200629 A1  Aug. 13, 2009

(30) Foreign Application Priority Data

Feb. 12, 2008  (JP) .................................. 2008-029936

(51) Int. Cl.
*H01L 21/00* (2006.01)
*H01L 31/0203* (2006.01)

(52) U.S. Cl. .......................................... 438/64; 257/433

(58) Field of Classification Search .................... 438/64, 438/68, 75, 106; 257/433–436, E31.117–E31.118
See application file for complete search history.

(56) References Cited

U.S. PATENT DOCUMENTS 7,651,881 B2 * 1/2010 Takasaki et al. ................ 438/64

FOREIGN PATENT DOCUMENTS

| JP | 06-021414 | 1/1994 |
|----|-----------|--------|
| JP | 2004-296453 | 10/2004 |

* cited by examiner

*Primary Examiner* — Calvin Lee
(74) *Attorney, Agent, or Firm* — SNR Denton US LLP

(57) ABSTRACT

A semiconductor device which includes a semiconductor chip formed with a light-reception area, a spacer, and a transparent substrate. The spacer is bonded to the semiconductor chip via a first adhesive and surrounding the light-reception area. The transparent substrate is bonded to the spacer via a second adhesive and disposed above the light-reception area. A first projection having a predetermined height is formed on a surface of the spacer which is on a side of the semiconductor chip, and the first projection abuts on the semiconductor chip.

7 Claims, 5 Drawing Sheets

SEMICONDUCTOR DEVICE AND MANUFACTURING METHOD THEREFOR

CROSS REFERENCES TO RELATED APPLICATIONS

The present invention contains subject matter related to Japanese Patent Application JP 2008-029936 filed in the Japanese Patent Office on Feb. 12, 2008, the entire contents of which are incorporated herein by reference.

BACKGROUND OF THE INVENTION

1. Field of the Invention

The present invention relates to semiconductor devices and manufacturing methods therefor, and more particularly, to a semiconductor device having a hermetically sealed light-receiving area formed on a semiconductor chip, and a manufacturing method therefor.

2. Description of the Related Art

An area sensor or a linear sensor using a solid-state imager device such as a CMOS (Complementary Metal Oxide Semiconductor) device is structured such that the solid-state imager device is accommodated in a hollow package made of, e.g., a ceramic or plastic material, in a hermetically sealed state to prevent ingress of moisture, dust and the like from outside. An area sensor or a linear sensor using such a hollow package is disclosed, for example, in Japanese Patent Application Publication No. 6-21414.

FIG. 4 is a cross-section outlining a configuration of a related-art solid-state image capture apparatus. In a solid-state image capture apparatus 101 herein shown, a solid-state imager device 104 is disposed in a cavity 103 formed approximately in a midsection of a base 102, e.g., a ceramic or plastic base, and electrically connected to leads 105, e.g., alloy-42 or copper leads, extending outward from a peripheral portion of the base, via bonding wires 106.

A frame 107 having a predetermined height is mounted just upon the leads, and a translucent lid 108 made of glass or the like is buried in a recess of the frame. A sealant made of an epoxy resin is used to bond the frame and the translucent lid together, thus hermetically sealing a cavity space with the translucent lid.

The above-described solid-state image capture apparatus is structured to protect its solid-state imager device from externally entering moisture, dust and the like, by hermetically sealing the cavity space with the translucent lid. However, this solid-state image capture apparatus encounters difficulty in sufficiently meeting a demand of miniaturization which has been placed by latest cameras for mounting on camera-incorporated mobile phones, digital still cameras and the like.

Namely, in the above-described solid-state image capture apparatus, its translucent lid is larger in planar size than its solid-state imager device, thus restricting the miniaturization.

In manufacturing the related-art solid-state image capture apparatus, a plurality of solid-state imager devices formed on a semiconductor wafer are divided into discrete pieces by using a dicing saw or the like, and each of the resultant solid-state imager devices is mounted on the base and then covered with the translucent lid. Thus, a process (dicing process) of dividing the semiconductor wafer into pieces is performed somewhere between the apparatus being in a semiconductor wafer state and the apparatus being in a solid-state imager device state ready to be covered with the translucent lid. In this dicing process, chipping and the like tend to adhere as dust to the light-receiving area of each solid-state imager device on the semiconductor wafer, possibly damaging a surface of the light-receiving area of the solid-state imager device.

In view of these points, a technique has been proposed, in which as shown in FIG. 5A, an adhesive layer 109 is formed on an outer peripheral portion of a light-receiving area 104A of a solid-state imager device 104, and a transparent plate 108, e.g., a glass plate, is disposed above the solid-state imager device to seal the light-receiving area by firm bonding with the adhesive layer, thereby keeping the light-receiving area of the solid-state imager device airtight (e.g., refer to Japanese Patent Application Publication No. 2004-296453).

If the technique described in Japanese Patent Application Publication No. 2004-296453 is used, the transparent plate can be smaller in planar size than the solid-state imager device, and in addition, since the sealing of the light-receiving area of each solid-state imager device precedes the dicing of the semiconductor wafer, the adhesion of the dicing-caused dust to the light-receiving area of the solid-state imager device can be suppressed.

However, with the technique described in Japanese Patent Application Publication No. 2004-296453, it is very difficult to keep a fixed gap between the transparent plate and the light-receiving area, because of a load applied during boding of the transparent plate.

In order to suppress the adhesive from being crushed by the load applied during bonding and thereby to keep the gap between the transparent plate and the light-receiving area fixed, it can be considered to mix a lot of filler particles with the adhesive. However, the mixture of a lot of filler particles may cause coming off of filler particles, and subsequent adhesion of dust to the light-receiving area. Consequently, this approach of mixing a lot of filler particles with the adhesive would not seem so appropriate.

To overcome this, another technique has been proposed, by which as shown in FIG. 5B, a spacer 112 coated with an adhesive 111 on both front and back surfaces of a copper spacer body 110 is formed by die-cutting or the like, and this spacer is bonded to a surrounding area of the light-receiving area 104A of the semiconductor chip 104, after which the spacer and the transparent plate are bonded together (see FIG. 5C). In this technique, as compared to the technique described in Japanese Patent Application Publication No. 2004-296453 in which the transparent plate is supported only by the adhesive, the crushing of the adhesive by the load applied during bonding of the transparent plate can be suppressed, and thus the gap between the transparent plate and the light-receiving area can be kept fixed.

In order for the spacer to be die-cut with the adhesive already applied to the front and back surfaces of its body, the adhesive is cured to some degree (i.e., semi-cured) for die-cutting.

SUMMARY OF THE INVENTION

However, since the semiconductor chip has an irregular surface because of various wiring and the like formed thereon, bonding with the semi-cured adhesive may fail unless an extremely high pressure is applied. Furthermore, since the adhesive is less fluid due to its being semi-cured, it is difficult to fill pits on the surface of the semiconductor chip with the adhesive, and thus even voids may be formed.

Accordingly, it is desirable to provide a semiconductor device and a manufacturing method therefor, enabling miniaturization, manufacture without application of high pressure, and proper suppression of void formation.

In one embodiment of the present invention, there is provided a semiconductor device which includes a semiconductor chip formed with a light-receiving area, a spacer bonded to the semiconductor chip via a first adhesive and surrounding the light-receiving area, and a transparent substrate bonded to the spacer via a second adhesive and disposed above the light-receiving area. In the semiconductor device, a first projection having a predetermined height is formed on a surface of the spacer which is on a side of the semiconductor chip, and the first projection abuts on the semiconductor chip.

The first projection having a predetermined height is formed on the surface of the spacer which is on a side of the semiconductor chip, and the first projection abuts on the semiconductor chip, by which the first adhesive is not crushed excessively even if a load is applied to the spacer. Accordingly, the spacer can be disposed at a predetermined position, and hence unintentional spreading of the first adhesive over a surrounding area can be suppressed.

Furthermore, a second projection having a predetermined height is formed on a surface of the spacer which is on a side of the transparent substrate, and the second projection abuts on the transparent substrate, by which the second adhesive is not crushed excessively even if a load is applied to the transparent substrate. Accordingly, the transparent substrate can be disposed at a predetermined position, and hence unintentional spreading of the second adhesive over a surrounding area can be suppressed.

Furthermore, on a periphery of a logic circuit formed on the semiconductor chip, a contact area between the spacer and the semiconductor chip is larger. Namely, on a peripheral area of the logic circuit which is highly heated in the semiconductor chip, the contact area between the spacer and the semiconductor chip is increased, whereas on an area excluding the peripheral area of the logic circuit, which is less heated, the contact area between the spacer and the semiconductor chip is decreased. Accordingly, the spacer dissipates more heat in the highly heated area and less heat in the less heated area, thereby making it possible to homogenize temperature within the semiconductor chip.

Furthermore, the spacer is made of a black material, by which incident reflected light onto the light-receiving area can be suppressed, and thus noises can be reduced.

In another embodiment of the present invention, there is provided a manufacturing method for a semiconductor device, which includes the steps of applying a first adhesive surrounding a light-receiving area formed on each of semiconductor chips built in a semiconductor wafer, disposing a spacer, in which at least a first projection having a predetermined height is formed on a surface which is on a side of the semiconductor wafer, on the first adhesive with the first projection abutting on the semiconductor wafer, bonding a transparent substrate to the spacer via a second adhesive to dispose the transparent substrate above the light-receiving area formed on the semiconductor chip and to form a body of linked semiconductor devices, and dividing the body of linked semiconductor devices into pieces.

The spacer formed with the at least first projection having a predetermined height on the surface which is on a side of the semiconductor wafer, is disposed on the first adhesive with the first projection abutting on the semiconductor wafer, by which the first adhesive is not crushed excessively even if a load is applied to the spacer. Accordingly, the spacer can be disposed at a predetermined position, and hence unintentional spreading of the first adhesive over a surrounding area can be suppressed.

Furthermore, for bonding the transparent substrate to the spacer via the second adhesive, the bonding is performed with the transparent substrate abutting on a second projection having a predetermined height and formed on a surface of the spacer which is on a side opposite to the side of the semiconductor wafer, by which the second adhesive is not crushed excessively even if a load is applied to the transparent substrate. Accordingly, the transparent substrate can be disposed at a predetermined position, and hence unintentional spreading of the second adhesive over a surrounding area can be suppressed.

According to the above embodiments of the present invention, the semiconductor device can be miniaturized and manufactured without application of high pressure, and also formation of voids can be suppressed.

DESCRIPTION OF THE PREFERRED EMBODIMENTS

Embodiments of the present invention are now described with reference to the accompanying drawings to help understand the present invention.

Figure 1A:
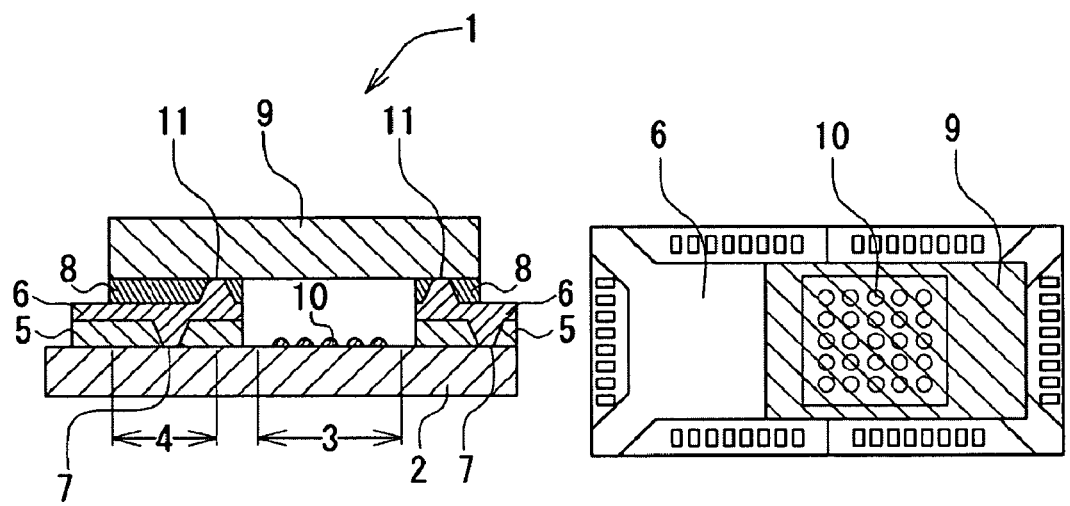
FIGS. 1A and 1B are schematic diagrams for explaining a CMOS solid-state image capture apparatus according to an embodiment of the present invention.

FIG. 1A is a schematic diagram for explaining a CMOS solid-state image capture apparatus which is an example of a semiconductor device according to an embodiment of the present invention. In a CMOS solid-state image capture apparatus 1 herein shown, packaging is implemented by hermetically sealing a light-receiving area 3 of a CMOS solid-state imager device 2.

The CMOS solid-state imager device includes the light-receiving area 3 having pixels arranged in matrix and formed of photodiodes storing signal charges proportional to incident light, and a logic circuit 4 performing various calculations, such as processing the signal charges stored in the light-receiving area.

A black spacer 6 is bonded to an area excluding the light-receiving area of the CMOS solid-state imager device (the "area excluding the light-receiving area" is hereinafter called "peripheral area"), via a highly thermal-conductive epoxy adhesive 5 containing a proper amount of a fine filler such as silver particles.

The spacer is formed by molding a resin material (e.g., an ABS resin, polycarbonate, a polyphenylene sulfide resin or the like) containing a proper amount of particles of a filler (e.g., a carbon fiber, a carbon nanotube, a ceramic material, a low-melting-point alloy or the like), and designed to have a thermal conductivity of 1 W/mK or higher.

On a lower surface (on a side of the CMOS solid-state imager device) of the spacer, a first projection 7 is formed, and bonded in a manner abutting on the CMOS solid-state imager device.

Furthermore, a glass substrate 9 is bonded to the spacer via a UV-curable epoxy adhesive 8, above the light-receiving area, to thereby hermetically seal the light-receiving area of the CMOS solid-state imager device. Reference numeral 10 in FIG. 1A represents a microlens formed per pixel.

On an upper surface (on a side of the glass substrate) of the spacer, a second projection 11 is formed, and bonded in a manner abutting on the glass substrate.

Figure 1B:
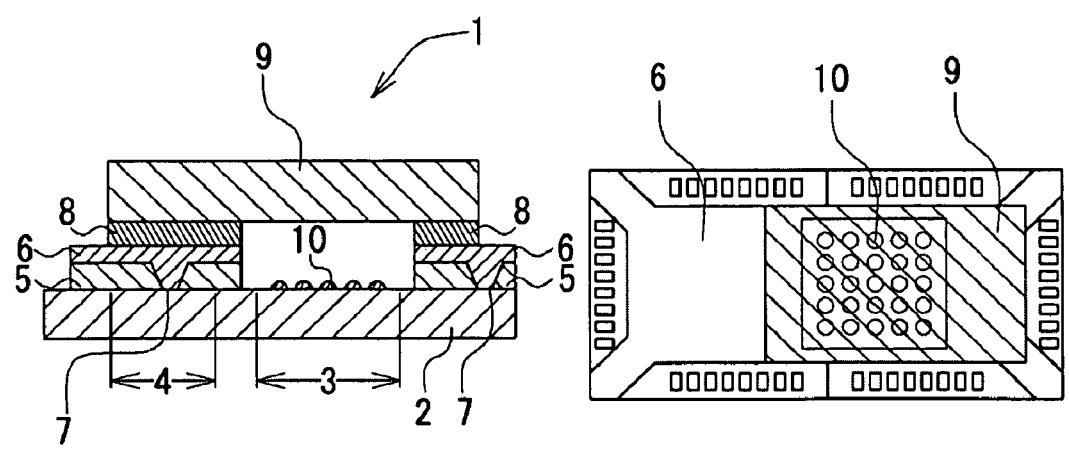

In this embodiment, a case has been illustratively described where the first and the second projections are formed on the lower and the upper surfaces of the spacer, respectively. However, it is not necessary to use the second projection as long as levelness of the spacer is sufficiently ensured with the first projection formed on the lower surface, and levelness of the glass substrate is also sufficiently ensured without the second projection formed on the spacer, and hence a gap between the glass substrate and the light-receiving area of the CMOS solid-state imager device can be fully controlled. If so, as shown in FIG. 1B, only the first projection may be formed on the lower surface of the spacer.

However, for more reliable control of the gap between the glass substrate and the light-receiving area of the CMOS solid-state imager device, it is preferable to form the first and the second projections on the lower and the upper surfaces of the spacer, respectively.

A manufacturing method for the CMOS solid-state image capture apparatus constructed as above is described below. Namely, a description is given of a manufacturing method for the CMOS solid-state image capture apparatus, as an example manufacturing method for a semiconductor device according to an embodiment of the present invention.

Figure 2A:
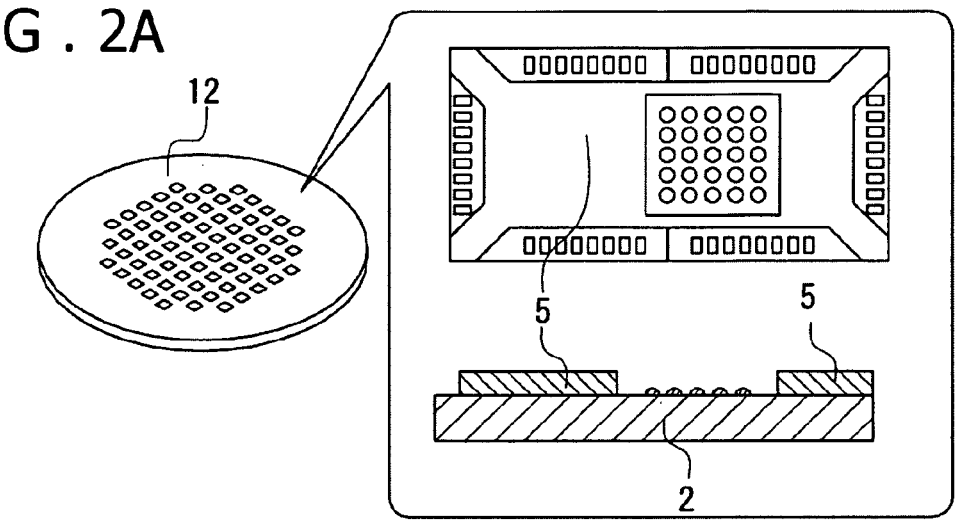
FIGS. 2A to 2C are schematic diagrams for explaining a first part of a manufacturing method for the CMOS solid-state image capture apparatus according to an embodiment of the present invention.

In the manufacturing method for the CMOS solid-state image capture apparatus according to the embodiment of the present invention, as shown in FIG. 2A, first, a semiconductor wafer 12 formed with CMOS solid-state imager devices is coated with the highly thermal-conductive epoxy adhesive 5 containing a proper amount of a fine filler such as silver particles, by a printing method.

Specifically, the epoxy adhesive 5 is applied by the printing method to a peripheral area of each of the CMOS solid-state imager devices formed on the semiconductor wafer 12, to a thickness of about 20 μm, covering an area smaller than the size of the spacer described later, by about 50 μm inward from spacer edges.

Figure 2B:
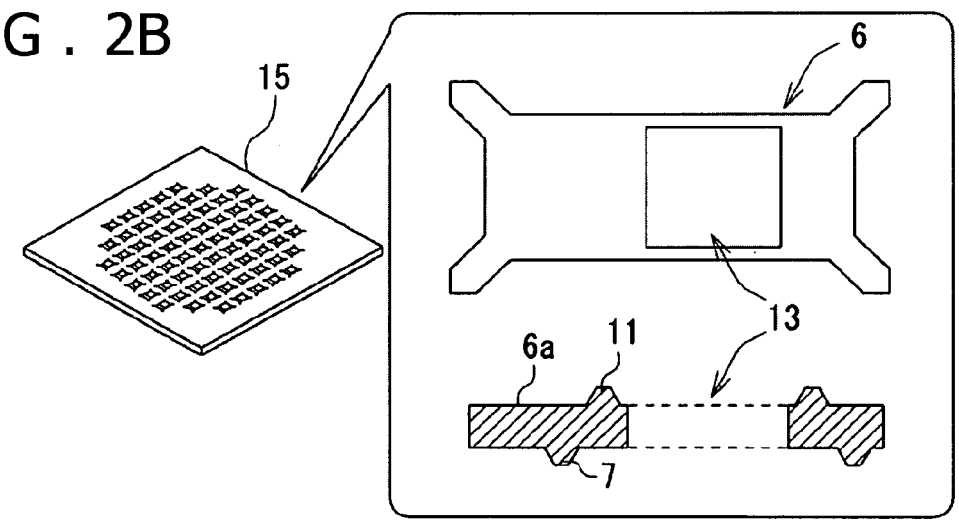

Then, by injection-molding the resin material (e.g., an ABS resin, polycarbonate, a polyphenylene sulfide resin or the like) containing a proper amount of particles of a filler (e.g., a carbon fiber, a carbon nanotube, a ceramic material, a low-melting-point alloy or the like), a body 15 of linked spacers in which multiple spacers are formed crisscross as a one-piece body such as shown in FIG. 2B is prepared, and thereafter diced into individual spacers 6.

In each of these spacers, an opening 13 is formed in an area corresponding to the light-receiving area, and the first projection 7 of about 15 μm high and the second projection 11 of about 15 μm high are formed on a lower and an upper surfaces of a spacer body 6a of about 50 μm thick, respectively.

Figure 2C:
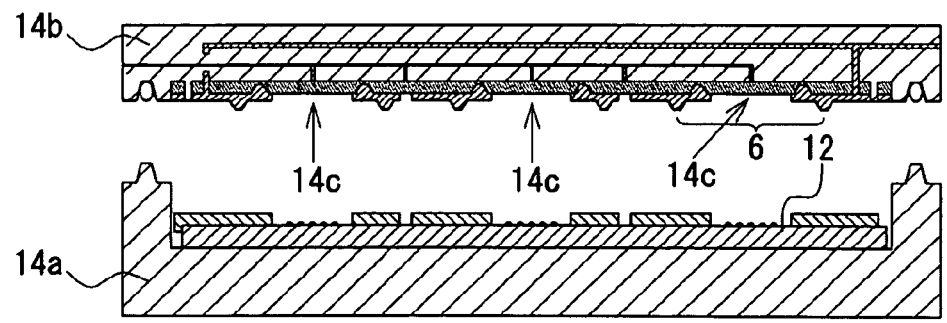

Next, as shown in FIG. 2C, the semiconductor wafer 12 is placed on a bonding stage 14a, and the spacers 6 vacuum-sucked with a sucking instrument 14b are disposed above the semiconductor wafer in alignment. Then, by lowering the sucking instrument, the spacers are bonded to the semiconductor wafer.

The sucking instrument is lowered until the first projections formed on the lower surfaces of the spacers abut on the semiconductor wafer, and the semiconductor wafer and the spacers are bonded together with the first projections abutting on the semiconductor wafer, respectively.

Besides holes for sucking and holding the spacers, the sucking instrument has holes 14c for reducing pressure within a bonding environment. By reducing the pressure within the bonding environment, gas to be produced from the epoxy adhesive 5 can be sucked.

Figure 3A:
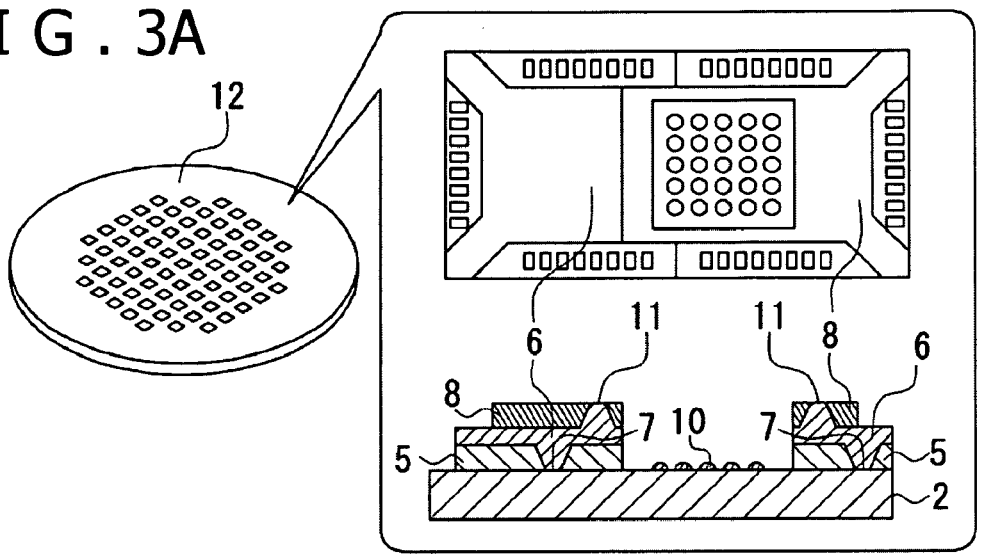
FIGS. 3A to 3C are schematic diagrams for explaining a second part of the manufacturing method for the CMOS solid-state image capture apparatus according to the embodiment of the present invention.
Figure 3B:
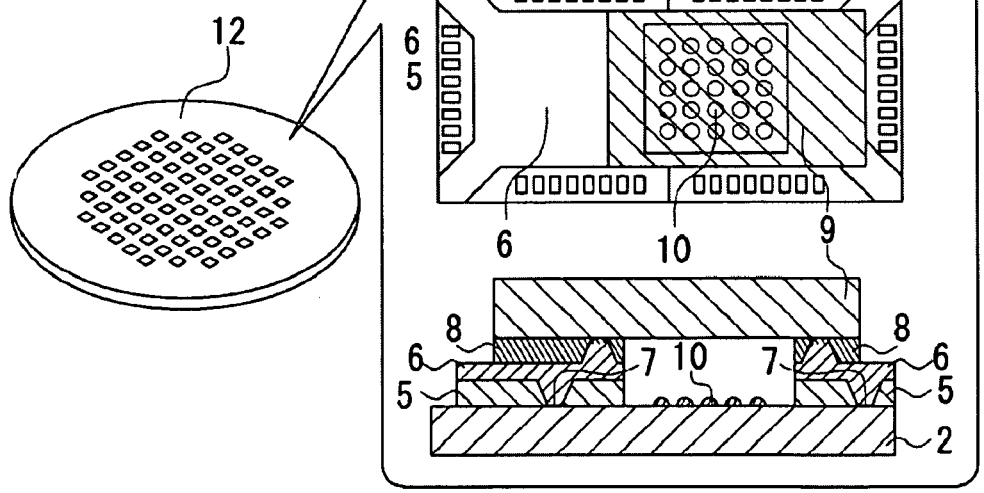

Then, by using a dispenser, the UV-curable epoxy adhesive 8 is applied to the upper surfaces of the spacers (see FIG. 3A), and the glass substrates 9 are disposed on the spacers to bond the spacers and the glass substrates together with the epoxy adhesive 8, respectively. In this manner, a body of linked CMOS solid-state image capture apparatuses is formed in which multiple CMOS solid-state image capture apparatuses are linked crisscross as a one-piece body (see FIG. 3B).

For disposing the glass substrates 9 on the spacers, the glass substrates are depressed until the second projections on the upper surfaces of the spacers abut on the glass substrates, and the spacers and the glass substrates are bonded together with the second projections abutting on the glass substrate, respectively.

Figure 3C:
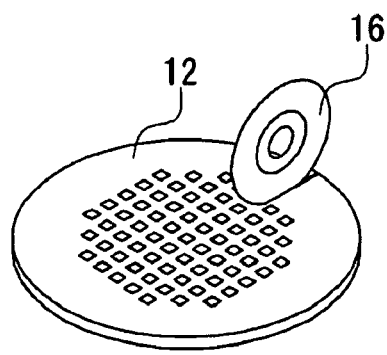
Figure 4:
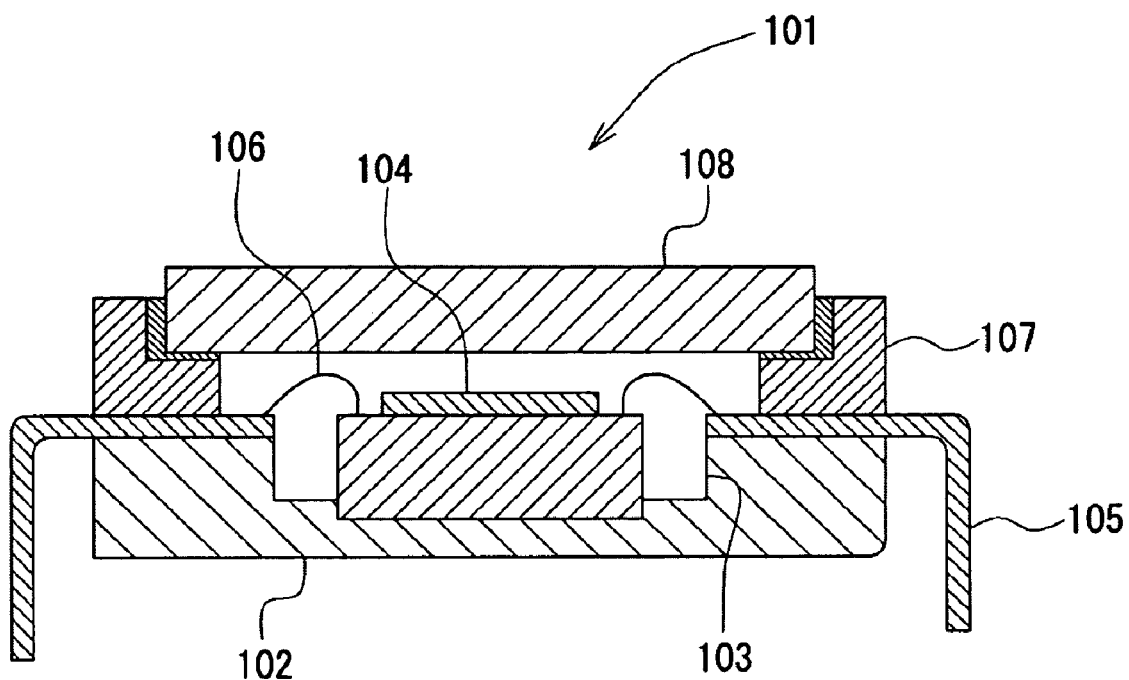
FIG. 4 is a schematic diagram showing a configuration of a related-art solid-state image capture apparatus.

Thereafter, with the semiconductor wafer stuck to a dicing tape (not shown), the body of linked CMOS solid-state image capture apparatuses is diced with a dicing blade 16 into discrete pieces (see FIG. 3C), so that the CMOS solid-state image capture apparatus shown in FIG. 1A can be obtained.

In the CMOS solid-state image capture apparatus according to the embodiment, the first projection is formed on the lower surface of the spacer, and the spacer and the CMOS solid-state imager device are bonded together with the first projection abutting on the CMOS solid-state imager device, so that the spacer does not get displaced vertically downward, and hence its levelness can be sufficiently ensured.

Figure 5A:
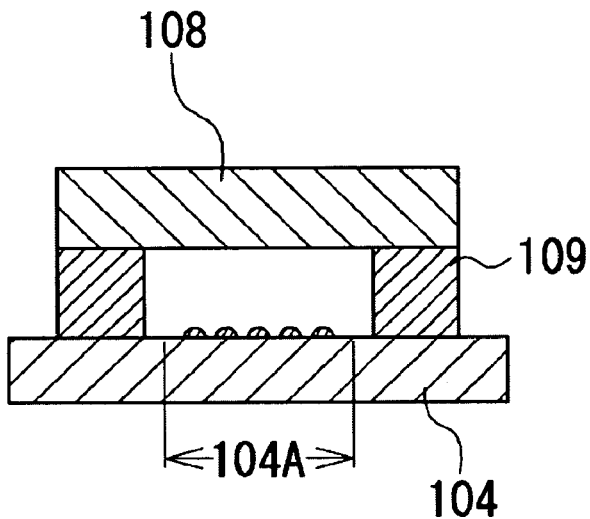
FIGS. 5A to 5C are schematic diagrams showing a configuration of another related-art solid-state image capture apparatus.

Namely, if the spacer is bonded without abutment on the CMOS solid-state imager device, i.e., as shown in FIG. 5A to be more specific, the epoxy adhesive 5 may be crushed by a load applied during bonding of the spacer, and this may displace the spacer vertically downward. By contrast, if the first projection is formed on the lower surface of the spacer, and the spacer and the CMOS solid-state imager device are bonded with the first projection abutting on the CMOS solid-state imager device, the spacer may not move vertically downward even if an excessive load is applied during its bonding. Consequently, the spacer does not get out of position vertically downward, and hence its levelness can be sufficiently ensured.

In addition, since the spacer does not get displaced vertically downward, the epoxy adhesive 5 is not unintentionally crushed by a load applied during bonding of the spacer, nor does any inconvenience occur due to the epoxy adhesive 5 spreading around.

Namely, if the spacer is bonded without abutment on the CMOS solid-state imager device, the spacer may get displaced vertically downward, and the spacer thus displaced would likely to crush the epoxy adhesive 5 and thereby cause the adhesive to unintentionally spread around. By contrast, if the first projection is formed on the lower surface of the spacer, and the spacer and the CMOS solid-state imager device are bonded with the first projection abutting on the CMOS solid-state imager device, the spacer does not get displaced vertically downward even if an excessive load is applied during its bonding. Accordingly, the epoxy adhesive 5 is neither crushed, nor unintentionally spread around consequently.

In the CMOS solid-state image capture apparatus according to the embodiment, the second projection is also formed on the upper surface of the spacer, and the spacer and the glass substrate are bonded with the second projection abutting on the glass substrate. Thus, the glass substrate does not get out of position vertically downward, and thus its levelness can be sufficiently ensured.

Namely, if the spacer is bonded without abutment on the glass substrate, the epoxy adhesive 8 may be crushed by a load applied during bonding to the glass substrate, and the glass substrate may get displaced vertically downward. By contrast, if the second projection is formed on the upper surface of the spacer, and the spacer and the glass substrate are bonded with the second projection abutting on the glass substrate, the glass substrate may not move vertically downward even if an excessive load is applied during its bonding. Consequently, the glass substrate does not get out of position vertically downward, and hence its levelness can be sufficiently ensured.

By sufficiently ensuring the levelness of the spacer with the first projection formed on the lower surface of the spacer and the levelness of the glass substrate with the second projection formed on the upper surface of the spacer, the gap between the light-receiving area of the CMOS solid-state imager device and the glass substrate can be controlled with high accuracy.

In addition, since the glass substrate does not get displaced vertically downward, the epoxy adhesive 8 is not crushed unintentionally by a load applied during bonding of the glass substrate, nor does any inconvenience occur due to the epoxy adhesive 8 spreading around.

Namely, if the spacer is bonded without abutment on the glass substrate, the glass substrate may get displaced vertically downward, and the glass substrate so displaced would likely to crush the epoxy adhesive 8 in a proportional amount and thereby cause the adhesive to spread around unintentionally. By contrast, if the second projection is formed on the upper surface of the spacer, and the spacer and the glass substrate are bonded with the second projection abutting on the glass substrate, the glass substrate does not get displaced vertically downward even if an excessive load is applied during its bonding. Accordingly, the epoxy adhesive 8 is not crushed, nor spread around unintentionally as a consequence.

Furthermore, in the CMOS solid-state image capture apparatus according to the embodiment, it is not a minimal area for supporting the glass substrate that the spacer is disposed on. Namely, irrespective of whether the logic circuit exists or not, according to the embodiment, a spacer whose surface extends equally widthwise is not disposed in a manner simply surrounding the light-receiving area, but the spacer is configured such that an area of contact with the CMOS solid-state imager device is increased on a side of a logic circuit forming area of the CMOS solid-state imager device (on a side near the logic circuit forming area) and is decreased on a side of a logic circuit non-forming area of the CMOS solid-state imager device (on a side far from the logic circuit forming area). It is therefore possible to promote heat dissipation from around the heat-producing logic circuit and thus to homogenize a temperature distribution within the CMOS solid-state imager device.

Furthermore, in the CMOS solid-state image capture apparatus according to the embodiment, the spacer is made of a black resin, thereby suppressing entrance into the light-receiving area of light reflected from a surrounding area, and hence reducing noises caused by the unintended incident light.

Furthermore, in the manufacturing method for the CMOS solid-state image capture apparatus according to the embodiment, the spacer is disposed after the epoxy adhesive 5 is applied to the semiconductor wafer, and thus it is not necessary for the epoxy adhesive 5 to be semi-cured. Accordingly, the adhesive can be applied in a highly fluid state, thereby suppressing creation of voids.

Figure 5B:
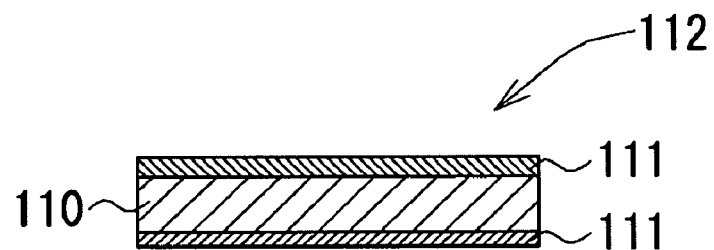
Figure 5C:
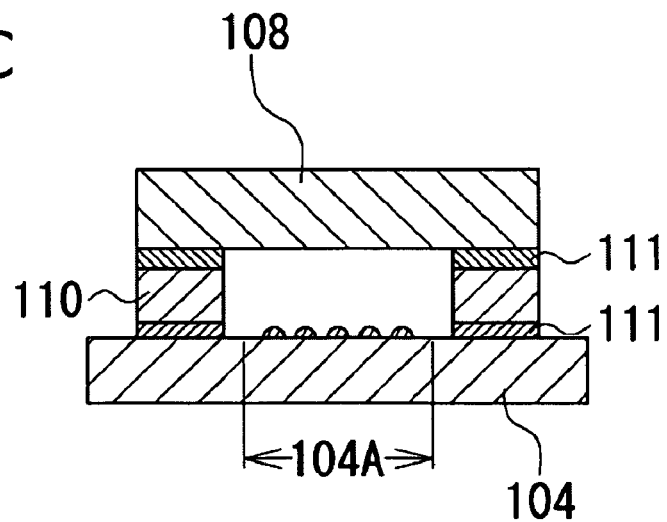

Namely, if a spacer having both upper and lower surfaces of its body coated with an adhesive is formed by die-cutting or the like, specifically, if a spacer such as shown in FIG. 5B is disposed on the semiconductor wafer by pressing, it is necessary for the epoxy adhesive 5 to be semi-cured for die-cutting. If the epoxy adhesive 5 is semi-cured, its fluidity lowers, so that irregularities on a semiconductor wafer surface may not be filled with the epoxy adhesive 5, causing void formation. By contrast, in the manufacturing method for the CMOS solid-state image capture apparatus according to the embodiment, the epoxy adhesive is applied to the semiconductor wafer in the highly fluid state, so that the irregularities of the semiconductor wafer surface can be filled with the epoxy adhesive 5 enough to suppress void formation.

In addition, since the epoxy adhesive 5 is not semi-cured, a low load is sufficient for bonding the spacer. Hence, even better manufacturing yields can be expected without special equipment and the like for applying a high load.

Even if the epoxy adhesive 5 for coating the semiconductor wafer is highly fluid, the epoxy adhesive 5 does not spread around unintentionally due to the spacer not getting out of position vertically downward as described above.

It should be understood by those skilled in the art that various modifications, combinations, sub-combinations and alterations may occur depending on design requirements and other factors insofar as they are within the scope of the appended claims or the equivalents thereof.

What is claimed is:

1. A manufacturing method for a semiconductor device, comprising the steps of:
    applying a first adhesive surrounding a light-receiving area on each of semiconductor chips built in a semiconductor wafer;
    disposing a spacer, in which at least a first projection having a predetermined height is on a surface which is on a side of the semiconductor wafer, on the first adhesive with the first projection abutting on the semiconductor wafer;
    bonding a transparent substrate to the spacer via a second adhesive on an upper surface of the spacer, the transparent substrate above the light-receiving area on the semiconductor chip, by which a body of linked semiconductor devices is formed; and
    dividing the body of linked semiconductor devices into pieces.

2. The manufacturing method for a semiconductor device according to claim 1, wherein the transparent substrate is bonded with the transparent substrate abutting a second projection having a predetermined height and on a surface of the spacer which is on a side opposite to the side of the semiconductor wafer.

3. A semiconductor device comprising:
    a semiconductor chip with a light-receiving area;
    a spacer bonded to the semiconductor chip via a first adhesive and surrounding the light-receiving area; and
    a transparent substrate bonded to the spacer via a second adhesive on an upper surface of the spacer, the transparent substrate above the light-receiving area,
    wherein,
        a first projection having a predetermined height is formed on a surface of the spacer which is on a side of the semiconductor chip, and
        the first projection abuts the semiconductor chip.

4. The semiconductor device according to claim 3, wherein a second projection having a predetermined height is formed on a surface of the spacer which is on a side of the transparent substrate.

5. The semiconductor device according to claim 3, wherein a contact area between the spacer and the semiconductor chip is increased on a periphery of a logic circuit formed on the semiconductor chip.

6. The semiconductor device according to claim 3, wherein the spacer is made of a black material.

7. The semiconductor device according to claim 3, wherein the spacer is made of a resin having a thermal conductivity of 1 W/mK or higher.

* * * * *